United States Patent [19]

Tokumaru et al.

[11] Patent Number: 5,620,327

[45] Date of Patent: Apr. 15, 1997

[54] ANTISTATIC SOCKET APPARATUS

[75] Inventors: Tomohide Tokumaru, Kanagawa; Toshiyuki Goto, Oita, both of Japan

[73] Assignee: Sony Corporation, Japan

[21] Appl. No.: 440,092

[22] Filed: May 12, 1995

[30] Foreign Application Priority Data

May 17, 1994 [JP] Japan ................................ 6-128232

[51] Int. Cl.[6] ........................................................ H01R 9/09
[52] U.S. Cl. .................................. 439/72; 439/70; 439/73
[58] Field of Search .................................... 439/70, 71, 72, 439/73, 948

[56] References Cited

U.S. PATENT DOCUMENTS

| 4,388,371 | 6/1983 | Bolon et al. ................................ 29/596 |
| 4,417,777 | 11/1983 | Bamford ..................................... 439/70 |
| 4,560,218 | 12/1985 | Billman et al. ............................ 439/70 |
| 4,595,794 | 6/1986 | Wasserman ................................ 439/71 |
| 4,684,184 | 8/1987 | Grabbe et al. ............................ 439/71 |
| 5,100,332 | 3/1992 | Egawa ........................................ 439/72 |
| 5,249,971 | 10/1993 | Lai et al. ................................... 439/70 |
| 5,395,255 | 3/1995 | Kato ........................................... 439/72 |
| 5,395,260 | 3/1995 | Hayakawa et al. ....................... 439/73 |

FOREIGN PATENT DOCUMENTS 2008333  5/1979  United Kingdom ..................... 439/71

*Primary Examiner*—Gary E. Elkins
*Attorney, Agent, or Firm*—Ronald P. Kananen

[57] ABSTRACT

Electrical connection between a measurement instrument and a semiconductor device having internal elements sealed in a non-conductive package, is established by way of leads which protrude out of the semiconductor device, when it is mounted on an antistatic socket apparatus. The socket apparatus has a bearer which is made of a non-conductive material that has a resistance selected to permit diffusion of static charges but which otherwise maintains adequate electrical insulation properties. Protrusions on a mounting surface of the socket support the package through contact surfaces which have a total area smaller than that of the mounting surface of the bearer and which reduce the static charge generating frictional contact between the package and the socket apparatus.

20 Claims, 2 Drawing Sheets

5,620,327

ANTISTATIC SOCKET APPARATUS

BACKGROUND OF THE INVENTION

1. Field of the Invention

The present invention relates to an antistatic socket apparatus that can be brought into contact with leads of a semiconductor device for allowing electrical conduction to take place between a measurement instrument and the semiconductor device.

2. Description of Related Art

When measuring electrical characteristics of a semiconductor device, the internal elements of which are sealed in a package made up of a non-conductive material such as resin, a special-purpose socket is used for allowing electrical conduction to take place between leads of the semiconductor device and a measurement instrument.

The socket mainly comprises a bearer, which is made up of a non-conductive material and has a mounting surface for mounting a semiconductor device, and metallic contactors arranged on the circumference of the bearer to be brought into contact with leads of the semiconductor device mounted on the mounting surface of the bearer.

When measuring electrical characteristics of a semiconductor device by way of this socket, the socket is connected to a measurement instrument in advance, and with the socket connected to the measurement instrument, the package of the semiconductor device is mounted on the mounting surface of the socket's bearer.

Then by slightly pressing the package, the leads of the semiconductor device can be brought into contact with the contactors of the socket, allowing electrical connection to be established between the semiconductor device and the measurement instrument.

In this state, predetermined signals are transmitted from the measurement instrument to the semiconductor device. Receiving these predetermined signals, the semiconductor device outputs response signals for use in the measurement of the semiconductor device's characteristics.

However, such a socket for measuring electrical characteristics of a semiconductor device has the following problem.

When the package of a semiconductor device is mounted on the mounting surface of the socket, contact friction is developed between the bearer of the socket and the package. Static electricity generated by the friction is accumulated inevitably inside the bearer which is made up of a non-conductive material.

For example, when using a bearer made up of polyethelimide (referred to hereafter as PEI) with a resistance value in the range $10^{16}$ to $10^{17}$ ohms, mounting and dismounting a semiconductor device more than 1,000 times onto and from the mounting surface of the bearer will accumulate static electricity in the bearer, giving rise to a voltage of more than 500 V.

In particular, the bearer of the socket uses a floating mechanism which insulates it and which forms a structure which prevents ready discharge of the accumulated static electricity.

With static electricity of such a high voltage accumulated in the bearer, bringing leads of a semiconductor device into contact with the contactors of the socket will cause the accumulated static electricity to be discharged through the semiconductor device, bringing about damage to the internal elements of the semiconductor device.

In order to prevent the internal elements from being damaged by such static electricity, ions bearing electric charge of a polarity opposite to the charge of the static electricity are blown against the socket to suppress the amount of the static electricity to a voltage of typically lower than 100 V. However, the complexity of the ion blowing process gives rise to other problems.

OBJECT AND SUMMARY OF THE INVENTION

It is an object of the present invention to provide an antistatic socket apparatus that can suppress charge of static electricity.

The present invention provides an antistatic socket apparatus designed for solving the problem described above.

The present invention provides an antistatic socket apparatus which allows electrical conduction to take place between a measurement instrument and a semiconductor device having its internal elements sealed in a package made up of a non-conductive material through leads protruding out of the semiconductor device while the semiconductor device is mounted on the antistatic socket apparatus. The antistatic socket apparatus comprises: a bearer which is made up of a non-conductive material and which has a mounting surface for mounting the package of the semiconductor device; metallic contactors arranged on the circumference of the bearer are brought into contact with the leads of the semiconductor device mounted on the mounting surface of the bearer; and protrusions formed having a total areas smaller than that of the mounting surface of the bearer, on the mounting surface for supporting the package of the semiconductor device on the contact surfaces.

As described above, the protrusions on the mounting surface of the bearer have contact surfaces with a total surface area smaller than that of the mounting surface. With a semiconductor device mounted on the bearer, the package of the semiconductor device is supported on these contact surfaces.

That is to say, the package made up of a non-conductive material is in contact with the bearer only through the contact surfaces of the protrusions. In comparison with the conventional socket wherein a package is in contact with the entire area of the mounting surface, the friction area between the package of the semiconductor device and the bearer of the antistatic socket apparatus is reduced, decreasing the amount of static electricity which accumulates on the bearer.

BRIEF DESCRIPTION OF THE DRAWINGS

FIG. 1A and 1B is shown an embodiment of an antistatic socket apparatus according to the present invention wherein FIGS. 1A and 1B are a cross-sectional diagram and a plane diagram respectively;

DETAILED DESCRIPTION OF THE PREFERRED EMBODIMENTS

The present invention will become apparent from the following detailed description of preferred embodiments with reference to accompanying diagrams.

Figure 1A:
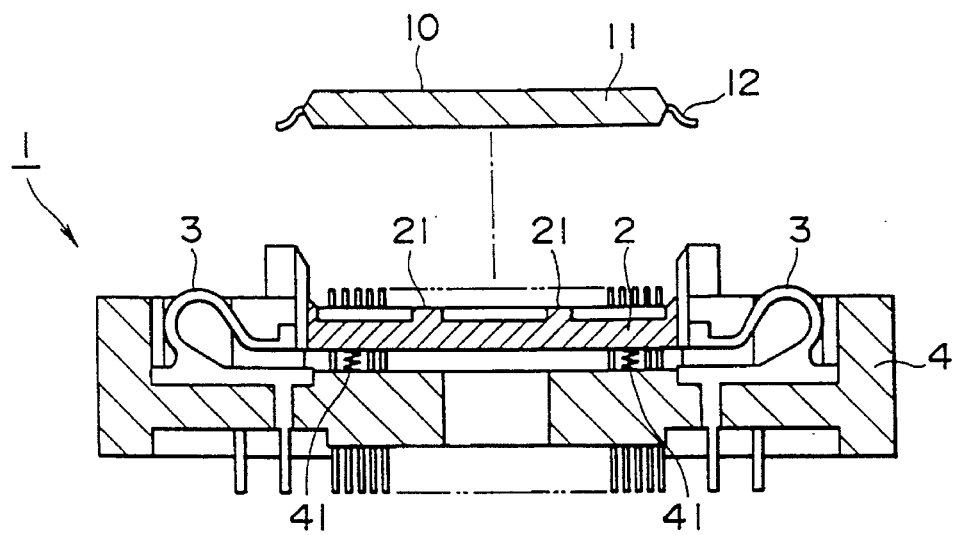
Figure 1B:
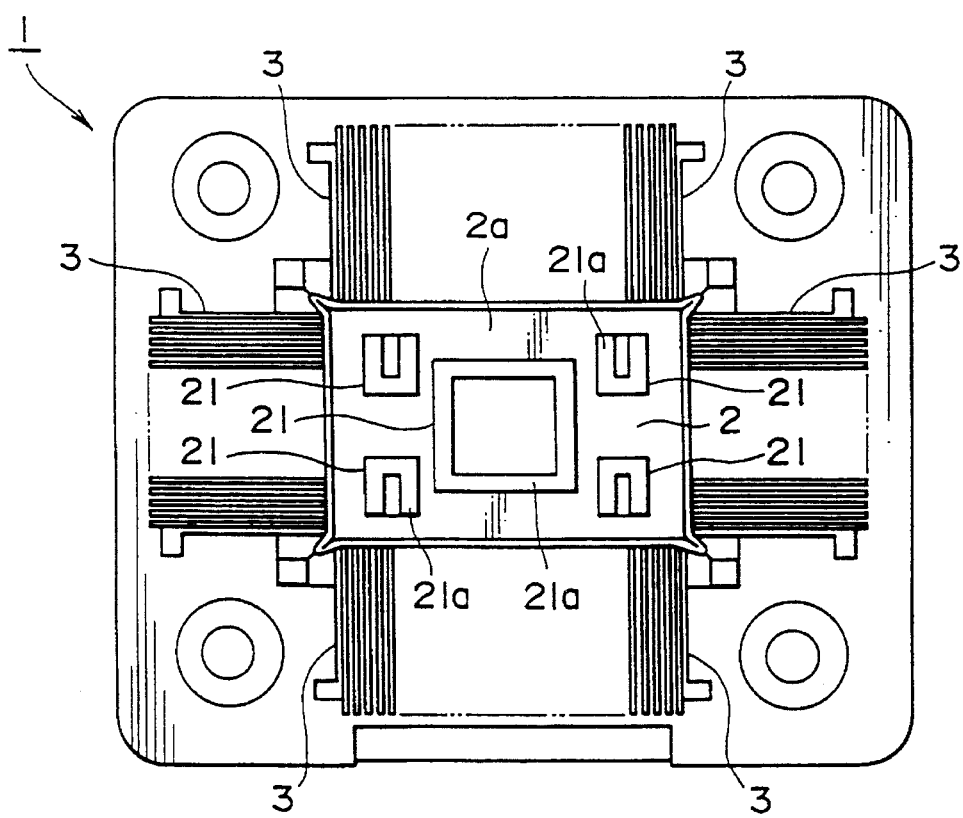

The antistatic socket apparatus 1 shown in FIG. 1A and 1B, allows electrical conduction to take place between leads 12 protruding out off at least two sides of a semiconductor device 1, or four sides in the case of a QFP (Quad Flat Package) type, and an external measurement circuit which is not shown in these figures. The antistatic socket apparatus is mainly used by connecting it to a measurement instrument such as a handler.

The semiconductor device 10 to be measured has a package 11 made up of a non-conductive material such as mold resin for sealing internal elements which are not shown in the figure. Typically, a plurality of leads 12 for inputting and outputting signals protrude out from at least two of its side surfaces.

By mounting such a semiconductor device 10 on the antistatic socket apparatus 1, electrical conduction is allowed to take place between the semiconductor device 10 and measurement circuits inside a measurement instrument such as a handler through the leads 12 of the semiconductor device 10.

The antistatic socket apparatus 1 comprises a bearer 2 for positioning and mounting the package 11 of the semiconductor device 10 on a mounting surface 2a thereof, and metallic contactors 3 arranged on the circumference of the bearer 2 to be brought into contact with the leads 12 with the semiconductor device 10 mounted on the mounting surface 2a. The metallic contactors 3 are arranged on at least two side surfaces of the bearer 2. The package 11 is typically made up of a non-conductive material such as PEI.

In the case of a QFP semiconductor device 10, for example, a plurality of leads 12 each protrude out off its four side surfaces. In order to establish contact with the leads 12, the metallic contactors 3 are arranged on the four circumference sides of the bearer 2 having an almost square shape at the same pitch as that of the leads 12.

The antistatic socket apparatus 1 is also equipped with protrusions 21 on the mounting surface 2a of the bearer 2. The protrusions 21 have contact surfaces 21a with a total area smaller than that of the mounting surface 2a. The contact surfaces 21a are each shown in FIG. 1B as a hatched area, an area covered with oblique lines.

Typically, the protrusions 21 are located at the center and four places on the circumference of the mounting surface 2a. With this arrangement, the package 11 of a semiconductor device 10 mounted on the bearer 2 can be supported on the contact surfaces 21a.

The bearer 2 is attached to a base 4 through springs 41. By slightly pressing the package 11 downward after mounting the semiconductor device 10 on the mounting surface 2a, the leads 12 of the semiconductor device 10 can be brought into contact with the metallic contactors 3 of the antistatic socket apparatus 1.

With the semiconductor device 10 mounted on the bearer 2 as described above, the semiconductor device 10 is in contact with the antistatic socket apparatus 1 only through the contact surfaces 21a of the protrusions 21 provided on the mounting surface 21a of the bearer 2.

That is to say, since the protrusions 21 are designed to have contact surfaces 21a with a total area smaller than that of the mounting surface 2a, the contact areas between the package 11 of the semiconductor device 10 are smaller than the entire area of the mounting surface 2a.

Since the contact area between the package 11 and the mounting surface 2a is reduced, the amount of friction between them is also reduced, decreasing the amount of static electricity generated thereon.

That is to say, in comparison with the conventional socket wherein the package 11 is in contact with the entire area of the mounting surface 2a, the amount of static electricity accumulated on the bearer 2 is decreased, increasing the number of times that the semiconductor device 10 can be mounted and dismounted on and from the bearer 2 before attaining the same amount of accumulated static electricity.

Figure 2:
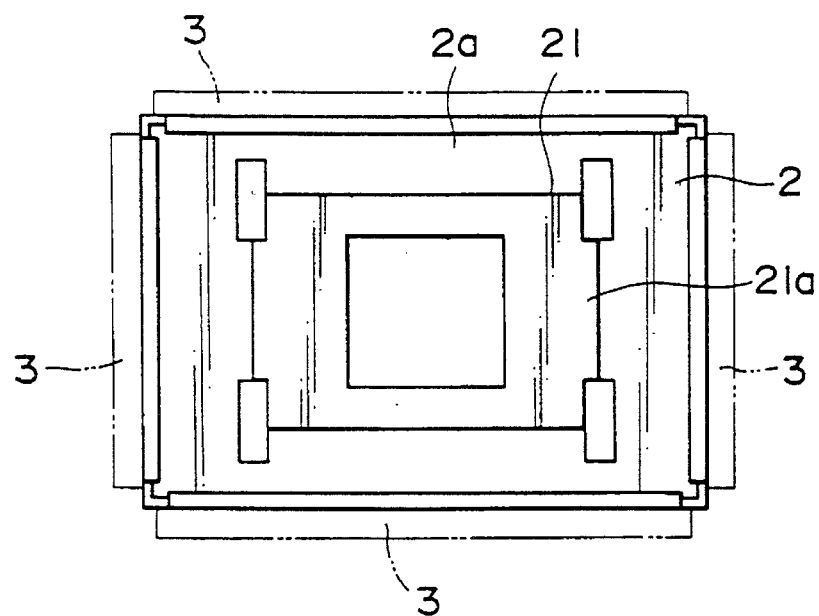
FIG. 2 shows a second embodiment of the present invention.
Figure 3:
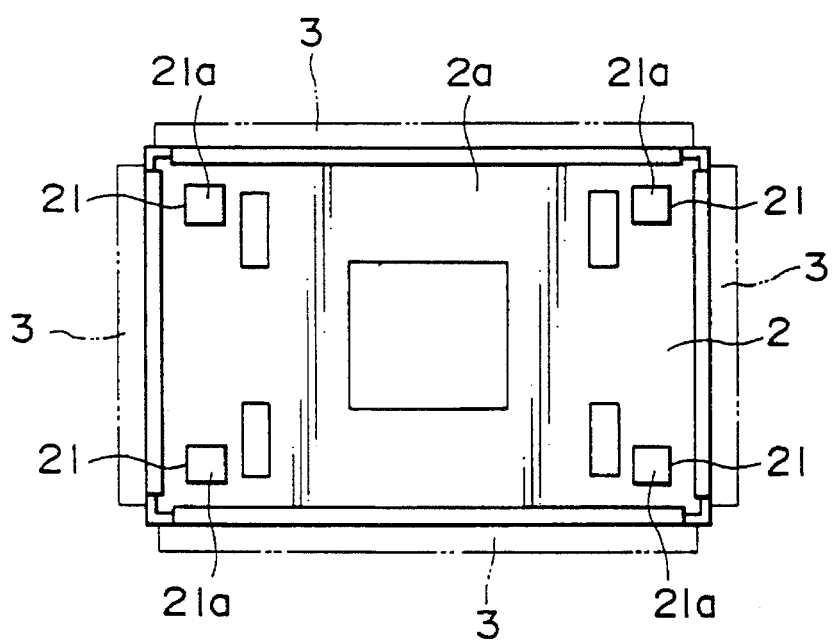
FIG. 3 is a partial plane diagram showing a third embodiment of the antistatic socket apparatus according to the present invention.

FIGS. 2 and 3 are plane diagrams partially showing second and third embodiments respectively each implementing the bearer 2 in accordance with the present invention.

As shown in FIG. 2, the protrusion 21 provided in the second embodiment implementing the bearer 2 in accordance with the present invention is located at about the center of the mounting surface 2a. The ratio of the area of the contact surface 21a to the total area of the mounting surface 2a is about 34.9%.

In the case of the third embodiment of FIG. 3 also implementing the bearer 2 in accordance with the present invention, the protrusions 21 are located at the four corners of the mounting surface 2a. In this case, the ratio of the area of the contact surface 21a to the total area of the mounting surface 2a is about 3.9%.

By decreasing the area ratio of the contact surface 21a to the mounting surface 2a as described above, the area of contact with the package 11 of the semiconductor device 10 to be mounted on the bearer 2 can be made smaller and, thus, the magnitude of static electricity generated by fraction can also be reduced as well.

It should be noted that, if the areas of the contact surfaces 21a of the protrusions 21 are too small, the stability of the mounted semiconductor device 10 is poor. The areas and positions of the protrusions 21 need to be determined appropriately in accordance with the size and shape of the semiconductor device 10 to be mounted.

The PEI material used for making the conventional bearer 2, is selected to have a resistance value in the range $10^{16}$ to $10^{17}$ ohms. Due to the floating structure of the bearer 2, static electricity can hardly be discharged out off the bearer 2.

In the case of the antistatic socket apparatus 1 provided by the present invention, on the other hand, the material used for making the bearer 2 can be a non-conductive material which has a resistance value smaller than that of the conventional material, allowing electric charge of static electricity to diffuse.

The PEI material used for making the bearer 2 according to the present invention on the other hand, is selected to have a resistance value typically ranging from $10^{10}$ to $10^{14}$ ohms, resistance values that allow electric charge of static electricity to diffuse with ease while sustaining its isolating or insulating characteristic.

The resistance of the material used for making the bearer 2 is kept as a low value as possible in a range that can sustain the isolating characteristic. The determination of the resistance value is based on characteristics of the semiconductor device 10 to be mounted and to be such as to withstand leak current.

By making the bearer 2 of a material with such a resistance value and providing the protrusions 21 described earlier on the mounting surface 2a of the bearer 2, the diffusion effect of static electricity generated by mounting and dismounting of the semiconductor device 10 and the reduction effect of the amount of accumulated static electricity can be obtained.

For example, by using PEI having a resistance value in the range $10^{10}$ to $10^{14}$ ohms as a material for making the bearer 2 of the antistatic socket apparatus 1, the amount of electric charge accumulated in the bearer 2 expressed in terms of volts is smaller than 100 even if the semiconductor device 10 is mounted and dismounted more than 1,000 times onto and from the bearer 2. This amount of accumulated electric charge is about the same as that obtained by suppressing static electricity by a technique blowing ions against the bearer 10.

In the case of the embodiments, PEI is used as a material for making the bearer 2. It should be noted, however, that the scope of the present invention is not limited to the embodiments.

As described above, the antistatic socket apparatus provided by the present invention has the following effects.

With the antistatic socket apparatus, the protrusions provided on the bearer allow the amount of electric charge of static electricity generated by friction experienced in mounting and dismounting the semiconductor device onto and from the bearer to be reduced. On top of that, by lowering the resistance value of the bearer accumulated static electricity can be diffused. As a result, the destruction of internal elements of the semiconductor device due to the discharging of the static electricity can be avoided.

In addition, it is not necessary to carry out the antistatic processing such as the ion blowing technique described earlier. Accordingly, the work efficiency of the characteristic measurement can be enhanced.

What is claimed is:

1. An antistatic socket apparatus (1) for allowing electrical conductivity to take place between a measurement instrument and an electronic component which is enclosed in a package through leads (12) protruding out of the package enclosing said electronic component, said antistatic socket apparatus comprising:

a bearer (2) made up of a predetermined non-conductive material for mounting the package of said electronic component on a mounting surface (2a) of said bearer, said predetermined non-conductive material being selected to have a resistance value which allows static charge to diffuse but which maintains a predetermined level of electrical insulation;

contactors (3) arranged on the circumference of said bearer and, with said electronic component mounted on said mounting surface, to be brought into contact with said leads; and a plurality of protrusions (21) provided on said mounting surface of said bearer for supporting said package in a non-contact relationship above said mounting surface, said protrusions being made of the predetermined non-conductive material and having a total surface area which is less than the surface are of said mounting surface, the total surface area being selected to reduce the amount of friction between said projections and the package and the amount of static electricity which is generate.

2. An antistatic socket apparatus according to claim 1, wherein one of said protrusions has a square first contact surface.

3. An antistatic socket apparatus (1) for allowing electrical conductivity to take place between a measurement instrument and an electronic component through leads (12) protruding out of said electronic component, said antistatic socket apparatus comprising:

a bearer (2) made up of a non-conductive material for mounting the package of said electronic component on a mounting surface (2a) of said bearer;

contactors (3) arranged on the circumference of said bearer and, with said electronic component mounted on said mounting surface, to be brought into contact with said leads; and a plurality of protrusions (21) provided on said mounting surface of said bearer for supporting said package, one of said protrusions having a first contact surface (21a) which has a square shape, wherein remaining protrusions each have a second contact surface and are each provided outside the first contact surface having the square shape.

4. An antistatic socket apparatus according to claim 3, wherein said second contact surfaces have a predetermined shape.

5. An antistatic socket apparatus according to claim 4, wherein said second contact surfaces are located outside said square in close proximity to the four corners of said square.

6. An antistatic socket apparatus (1) for allowing electrical conductivity to take place between a measurement instrument and an electronic component through leads (12) protruding out of said electronic component, said antistatic socket apparatus comprising:

a bearer (2) made up of a non-conductive material for mounting the package of said electronic component on a mounting surface (2a) of said bearer;

contactors (3) arranged on the circumference of said bearer and, with said electronic component mounted on said mounting surface, to be brought into contact with said leads; and a plurality of protrusions (21) provided on said mounting surface of said bearer for supporting said package, one of said protrusions having a first contact surface (21a) which has a square shape, and wherein the first square contact surface has one pair of parallel sides different in side width from the other pair of parallel sides.

7. An antistatic socket apparatus (1) for allowing electrical conductivity to take place between a measurement instrument and an electronic component through leads (12) protruding out of said electronic component, said antistatic socket apparatus comprising:

a bearer (2) made up of a non-conductive material for mounting the package of said electronic component on a mounting surface (2a) of said bearer;

contactors (3) arranged on the circumference of said bearer and, with said electronic component mounted on said mounting surface, to be brought into contact with said leads; and a plurality of protrusions (21) provided on said mounting surface of said bearer for supporting said package spacedly above said mounting surface, wherein said mounting surface is essentially rectangular in shape and wherein said protrusions are made of said non-conductive material, each essentially rectangular in shape and are each located so as to project vertically up from said mounting surface proximate a corner of said mounting surface.

8. An antistatic socket apparatus (1) for allowing electrical conductivity to take place between a measurement instrument and an electronic component through leads (12) protruding out of said electronic component, said antistatic socket apparatus comprising:

a bearer (2) for mounting the package of said electronic component on a amounting surface (2a) of said bearer;

contactors (3) arranged on the circumference of said bearer and, with said electronic component mounted on said mounting surface, to be brought into contact with said leads; and a plurality of protrusions (21) provided on said mounting surface of said bearer for supporting said package above said mounting surface, one of said protrusions having a first contact surface (21a) which has a square shape, and wherein said bearer and said plurality of protrusions are made up of a non-conductive material with a resistance value smaller than a range of $10^{16}$ to $10^{17}$ ohms.

9. An antistatic socket apparatus according to claim 8, wherein said bearer has a resistance value in the range $10^{10}$ to $10^{14}$ ohms.

10. An antistatic socket apparatus according to claim 9, wherein polyethelimide is used as a material for making said bearer.

11. An antistatic socket apparatus (1) for allowing electrical conductivity to take place between a measurement instrument and a semiconductor device, wherein internal elements of the semiconductor device are sealed in a package (11) made up of a non-conductive material, through leads (12) protruding out of at least two parallel sides of said semiconductor device, said antistatic socket apparatus comprising:

a nearly square bearer (2) made up of a non-conductive material for mounting said package of said semiconductor device on a mounting surface (2a) of said bearer;

contactors (3) arranged on at least two parallel sides of said bearer and, with said semiconductor device mounted on said mounting surface, to be brought in contact with said leads; and protrusions (21) provided on said mounting surface of said bearer, a predetermined one of said protrusions having a first contact surface (21a) for supporting said package.

12. An antistatic socket apparatus according to claim 11, wherein said first contact surface is formed to constitute a square.

13. An antistatic socket apparatus according to claim 12, wherein remaining protrusions each having a second contact surface are provided outside said square.

14. An antistatic socket apparatus according to claim 13, wherein the forms of said second contact surfaces each resemble the special character ].

15. An antistatic socket apparatus according to claim 14, wherein said second contact surfaces each resembling the special character ] are located outside said square in close proximity to the four corners of said square.

16. An antistatic socket apparatus according to claim 12, wherein said first square contact surface has one pair of parallel sides different in side width from the other pair of parallel sides.

17. An antistatic socket apparatus according to claim 11, wherein said protrusions are located at the corners of said mounting surface.

18. An antistatic socket apparatus according to claim 11, wherein said bearer is made up of a non-conductive material with a resistance value smaller than that of a material which has a resistance in the range of $10^{16}$ to $10^{17}$ ohms.

19. An antistatic socket apparatus according to claim 11, wherein said bearer has a resistance value in the range $10^{10}$ to $10^{14}$ ohms.

20. An antistatic socket apparatus according to claim 19, wherein polyethelimide is used as a material for making said bearer.

* * * * *